United States Patent
Lee et al.

(10) Patent No.: US 9,564,295 B2
(45) Date of Patent: Feb. 7, 2017

(54) DIAGNOSIS SYSTEM FOR PULSED PLASMA

(71) Applicant: SAMSUNG ELECTRONICS CO., LTD., Suwon-si, Gyeonggi-do (KR)

(72) Inventors: Dong-soo Lee, Hwaseong-si (KR); Sung-ho Jang, Suwon-si (KR); Byeong-hee Kim, Seoul (KR); Doug-yong Sung, Seoul (KR); Dong-ok Shin, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 8 days.

(21) Appl. No.: 14/827,347

(22) Filed: Aug. 17, 2015

(65) Prior Publication Data
US 2016/0126068 A1 May 5, 2016

(30) Foreign Application Priority Data
Nov. 4, 2014 (KR) .................. 10-2014-0152086

(51) Int. Cl.
| | | |
|---|---|---|
| *G01J 3/30* | (2006.01) | |
| *H01J 37/32* | (2006.01) | |
| *G01J 1/44* | (2006.01) | |
| *G01J 1/42* | (2006.01) | |

(52) U.S. Cl.
CPC ............ *H01J 37/32146* (2013.01); *G01J 1/44* (2013.01); *H01J 37/32091* (2013.01); *H01J 37/32935* (2013.01); *H01J 37/32972* (2013.01); *G01J 2001/4238* (2013.01); *G01J 2001/4453* (2013.01)

(58) Field of Classification Search
CPC ........ G01N 21/73; G01N 21/68; G01N 21/67; G01N 21/69; G01J 3/443; H01J 49/105; H05H 1/30
See application file for complete search history.

(56) References Cited

U.S. PATENT DOCUMENTS

| | | | | |
|---|---|---|---|---|
| 5,565,114 | A | * | 10/1996 | Saito ...................... G01N 21/68 156/345.25 |
| 5,871,658 | A | | 2/1999 | Tao et al. |
| 5,928,528 | A | * | 7/1999 | Kubota ............. H01J 37/32706 118/708 |
| 6,160,621 | A | * | 12/2000 | Perry ................. G01B 11/0683 250/559.27 |
| 6,455,437 | B1 | | 9/2002 | Davidow et al. |
| 6,472,822 | B1 | | 10/2002 | Chen et al. |

(Continued)

FOREIGN PATENT DOCUMENTS

| | | |
|---|---|---|
| JP | 05-190503 A | 7/1993 |
| JP | 09-306894 A | 11/1997 |

(Continued)

OTHER PUBLICATIONS

Korean Office Action dated Apr. 4, 2016 in Corresponding Korean Patent Application No. 10-2014-0152086.

*Primary Examiner* — Abdullahi Nur
(74) *Attorney, Agent, or Firm* — Lee & Morse, P.C.

(57) ABSTRACT

A diagnosis system for pulsed plasma includes an optical emission sensor (OES) to receive light generated the pulsed plasma, the pulsed plasma having been generated in accordance with a pulse signal, a digitizer to synchronize the electrical signal with the pulse signal, and an analyzer to analyze the synchronized electrical signal.

18 Claims, 9 Drawing Sheets

(56) References Cited

U.S. PATENT DOCUMENTS

| | | |
|---|---|---|
| 6,894,786 B1 | 5/2005 | Holbrook et al. |
| 6,911,157 B2 | 6/2005 | Edamura et al. |
| 7,297,560 B2 | 11/2007 | Yue |
| 7,339,656 B2 | 3/2008 | Matsumoto et al. |
| 7,878,145 B2 | 2/2011 | Fang et al. |
| 8,685,267 B2 | 4/2014 | Yatsuda et al. |
| 2002/0029851 A1 | 3/2002 | Edamura et al. |
| 2004/0016402 A1 | 1/2004 | Walther et al. |
| 2005/0034811 A1 | 2/2005 | Mahoney et al. |
| 2008/0047579 A1 | 2/2008 | Ji et al. |
| 2009/0090616 A1 | 4/2009 | Du et al. |

FOREIGN PATENT DOCUMENTS

| | | |
|---|---|---|
| JP | 2002-093781 A | 3/2002 |
| JP | 2012-009544 A | 1/2012 |
| KR | 10-2005-0027668 A | 3/2005 |
| KR | 10-2005-0048979 A | 5/2005 |
| KR | 10-2005-0055048 A | 6/2005 |

\* cited by examiner

DIAGNOSIS SYSTEM FOR PULSED PLASMA

CROSS-REFERENCE TO RELATED APPLICATION

Korean Patent Application No. 10-2014-0152086, filed on Nov. 4, 2014, in the Korean Intellectual Property Office, and entitled: "Diagnosis System for Pulsed Plasma," is incorporated by reference herein in its entirety.

BACKGROUND

1. Field

Embodiments relate to a diagnosis system for pulsed plasma, and more particularly, to an optical emission sensor (OES) based diagnosis system for pulsed plasma.

2. Description of the Related Art

As semiconductor elements have been recently shrinking and made by laminating, a pulsed radio frequency (RF) power supply has been used instead of a continuous wave (CW) RF power supply in order to improve the selection ratio and profile in a deposition or etching process.

However, due to lack of a diagnosis system capable of monitoring the characteristics of pulsed plasma formed by the pulsed RF power supply in current facilities, even the basic characteristics of pulsed plasma have not been determined so far.

SUMMARY

One or more embodiments are directed to a diagnosis system for pulsed plasma, the diagnosis system including: a chamber in which light is generated by a reaction between a substrate and the pulsed plasma; a first pulsed RF power supply to provide to the chamber first pulsed RF power corresponding to a pulse signal; an optical emission sensor (OES) to sense and convert the generated light into an electrical signal; a digitizer to synchronize the electrical signal with the pulse signal; and an analyzer to analyze the synchronized electrical signal.

In some embodiments, the optical emission sensor may be a photo multiplier tube (PMT).

In some embodiments, the photo multiplier tube and the digitizer may have a nanosecond time resolution.

In some embodiments, the pulse signal may be supplied by electrical T-branching of a signal generated by the first pulsed RF power supply or by direct connection with the first pulsed RF power supply.

In some embodiments, the analyzer may determine a magnitude of the pulsed plasma at a specific time.

In some embodiments, a period of the pulse signal may be divided into a pulse-on period and a pulse-off period, and the analyzer may analyze the synchronized electrical signal from a start point of the pulse-on period or the pulse-off period.

In some embodiments, a period of the pulse signal may be divided into the pulse-on period and the pulse-off period, and the analyzer may analyze may determine a magnitude of the electrical signal in the pulse-on period or a magnitude of the electrical signal in the pulse-off period.

In some embodiments, a period of the pulse signal may be divided into the pulse-on period and the pulse-off period, and the analyzer may determine may be at least one from among a first maximum signal magnitude value that is the maximum electrical signal magnitude value in the pulse-on period, a first maximum signal time when the first maximum signal magnitude value is shown, a first minimum signal magnitude value that is the minimum electric signal magnitude value in the pulse-on period, a first minimum signal time when the first minimum signal magnitude value is shown, a first average signal magnitude value that is an average of an electrical signal magnitude value in the pulse-on period, a first standard deviation value showing a standard deviation corresponding to the first average signal magnitude value, a second maximum signal magnitude value that is the maximum electrical signal magnitude value in the pulse-off period, a second maximum signal time when the second maximum signal magnitude value is shown, a second minimum signal magnitude value that is the minimum electrical signal magnitude value in the pulse-off period, a second minimum signal time when the second minimum signal magnitude value is shown, a second average signal magnitude value that is an average of an electrical signal magnitude value in the pulse-off period, and a second standard deviation value showing a standard deviation corresponding to the second average signal magnitude value.

In some embodiments, the analyzer may determine a period of pulsed plasma, and the period of pulsed plasma may be measured by using a time difference between the first maximum signal times, a time difference between the first minimum signal times, a time difference between the second maximum signal times, or a time difference between the second minimum signal times.

In some embodiments, the period of pulsed plasma may be divided into a duty-on period that is defined as from the first point in time when the electrical signal magnitude value becomes equal to or greater than a start threshold level in the pulse-on period to the first point in time when the electrical signal magnitude value becomes equal to or less than an end threshold level outside the pulse-on period, and a duty-off period that is defined as a remaining period of the period of pulsed plasma excluding the duty-on period, and the analyzer may determine a duty ratio that is a ratio of the duty-on period to the period of pulsed plasma.

In some embodiments, the pulse signal may have a period of a supplied pulse, and the analyzer may analyze the synchronized electrical signals over at least two periods of the supplied pulse. The analyzer may determine a period of the pulsed plasma and to compare the period of the pulsed plasma to the period of the pulse signal.

In some embodiments, the diagnosis system for the pulsed plasma may further include an amplifier amplifying the electrical signal that is converted in the optical emission sensor.

In some embodiments, the diagnosis system for the pulsed plasma may further include a second pulsed RF power supply which provides second pulsed RF power including the pulse signal to the chamber.

In some embodiments, the first and second pulsed RF power supplies may share a pulse controller generating the pulse signal.

In some embodiments, the first and second pulsed RF power supplys may respectively include a pulse RF generator generating the pulse signal.

In some embodiments, a first RF frequency of the first pulsed RF power supply may be higher than a second RF frequency of the second pulsed RF power supply.

In some embodiments, the diagnosis system for the pulsed plasma may further include an optical filter that select a wavelength to be measured from among the light and is optically connected between the chamber and the optical emission sensor.

In some embodiments, the diagnosis system for the pulsed plasma may further include a bias power generating device which is disposed on a lower portion in the chamber.

One or more embodiments are directed a pulsed plasma diagnostic apparatus including: a chamber in which light is generated by an etching reaction of an substrate and a pulsed plasma; a pulsed RF power supply which provides pulsed RF power including a pulse signal to the chamber; an optical emission sensor outputting an electrical signal which is electrically converted from the light; a digitizer synchronizing the electrical signal with the pulse signal; and a detector detecting an etch end point time by using a magnitude of the synchronized electrical signal.

One or more embodiments are directed to a diagnosis system for pulsed plasma, including an optical emission sensor (OES) to receive light generated by the pulsed plasma and output an electrical signal in accordance with the light, the pulsed plasma having been generated in accordance with a pulse signal, a digitizer to synchronize the electrical signal with the pulse signal, and an analyzer to analyze the synchronized electrical signal.

The pulsed plasma having been generated by a radio frequency, wherein the optical emission sensor has a time resolution on an order of the radio frequency.

The optical emission sensor is a photo multiplier tube (PMT).

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

It will be understood that, although the terms first, a second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings herein.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of at least one other features, integers, steps, operations, elements, components, and/or groups thereof.

Figure 1A:
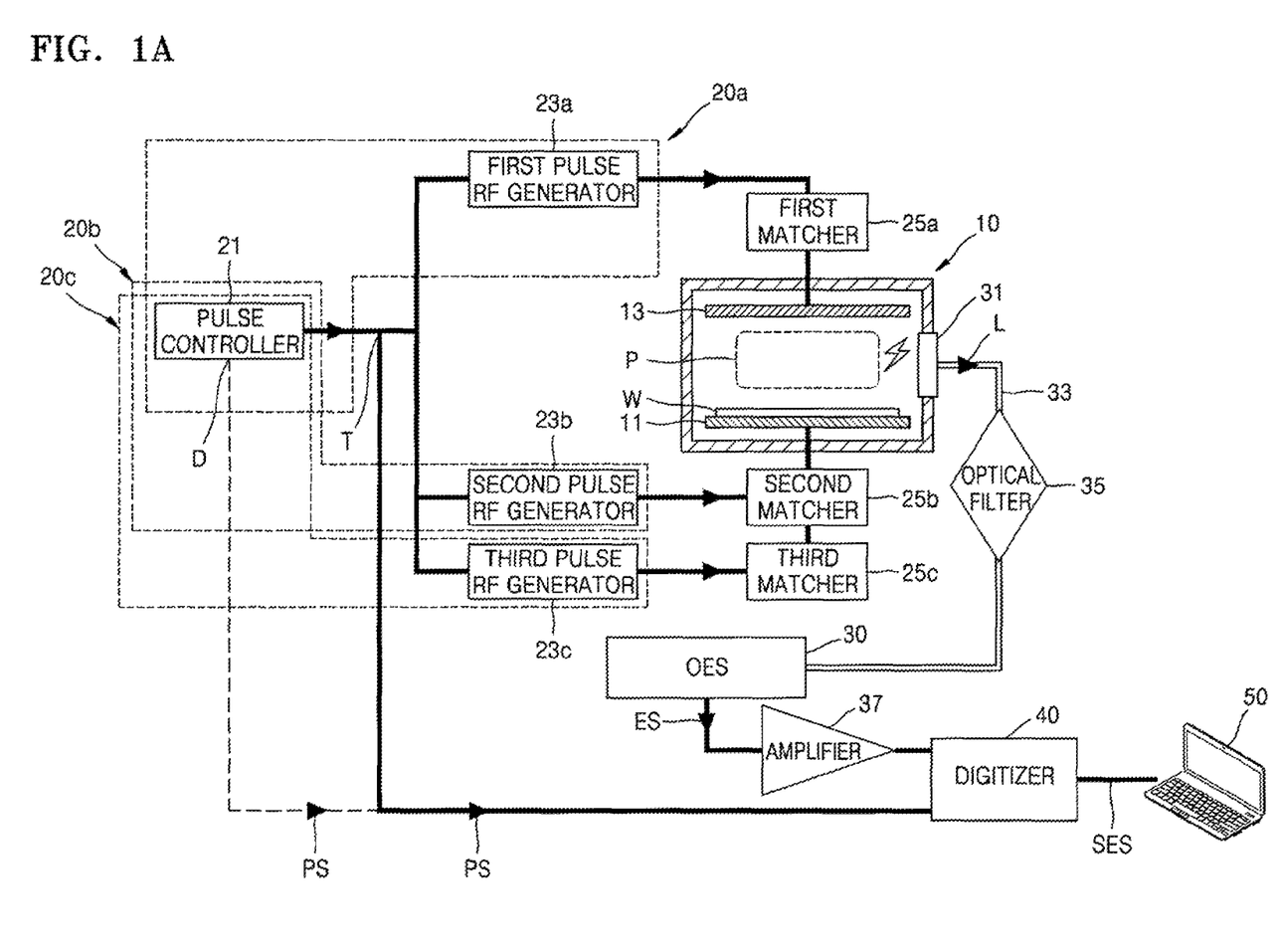
FIGS. 1A and 1B illustrate schematic diagrams of a diagnosis system for pulsed plasma according to some exemplary embodiments, respectively.

FIG. 1A illustrates a schematic diagram of a diagnosis system for pulsed plasma according to some exemplary embodiments.

Referring to FIG. 1A, the diagnosis system for pulsed plasma may include a chamber 10 in which a substrate W is provided, first to third pulsed RF power supplies 20a to 20c to provide first pulsed RF power to the chamber so as to generate pulsed plasma P, an optical emission sensor (OES) 30 to sense a light signal L emitted by a reaction between the substrate W and the pulsed plasma P in the chamber 10 and to output an electrical signal ES corresponding thereto, a digitizer 40 to synchronize the electrical signal ES with a pulse signal PS having a period of a supplied pulse equal to a pulse period output by a pulse controller 21, and an analyzer 50 to measure a parameter of the synchronized electrical signal SES distinguished according to the pulse signal PS. In some embodiment, the OES 30 may be a photo multiplier tube.

A chuck 11 to hold the substrate W in order to perform semiconductor processes may be located in a lower portion in the chamber 10. A gas supply (not shown) to supply a reaction gas to perform the semiconductor processes and a gas exhaust (not shown) to exhaust the gas after the reaction is finished may be located at a side of the chamber 10. A plate-like upper electrode 13 to form the reaction gas for generation of the pulsed plasma P may be located at an upper portion in the chamber 10. The chuck 11 may include a plate-like lower electrode. In some embodiments, the reaction of the pulsed plasma P and the substrate W may be at least one from among a deposition reaction, an etching reaction, an ion implantation reaction, and a diffusion reaction, but is not limited thereto. The diagnosis system for pulsed plasma according to an embodiment may be used for any physical and/or chemical reactions that generate light due to interaction between the pulsed plasma P and the substrate W. In some embodiments, the diagnosis system may be used to analyze light generated by the pulsed plasma alone, e.g., in a chamber without a substrate W.

In order to generate the pulsed plasma P in the chamber 10, the first pulsed RF power supply 20a may be connected to the upper electrode 13, and second and third pulsed RF power supplies 20b and 20c may be connected to the lower electrode in the chuck 11. The first to third pulsed RF power supplies 20a, 20b, and 20c may commonly include the pulse controller 21 generating a pulse and may respectively include first to third pulse RF generators 23a, 23b, and 23c. The first to third pulse RF generators 23a, 23b, and 23c may respectively generate first to third pulsed RF powers by respectively mixing pulse power generated by the pulse controller 21 and first to third RF powers. The first to third pulsed RF power supplies 20a, 20b, and 20c will be described in detail with reference to FIG. 2.

Figure 2:
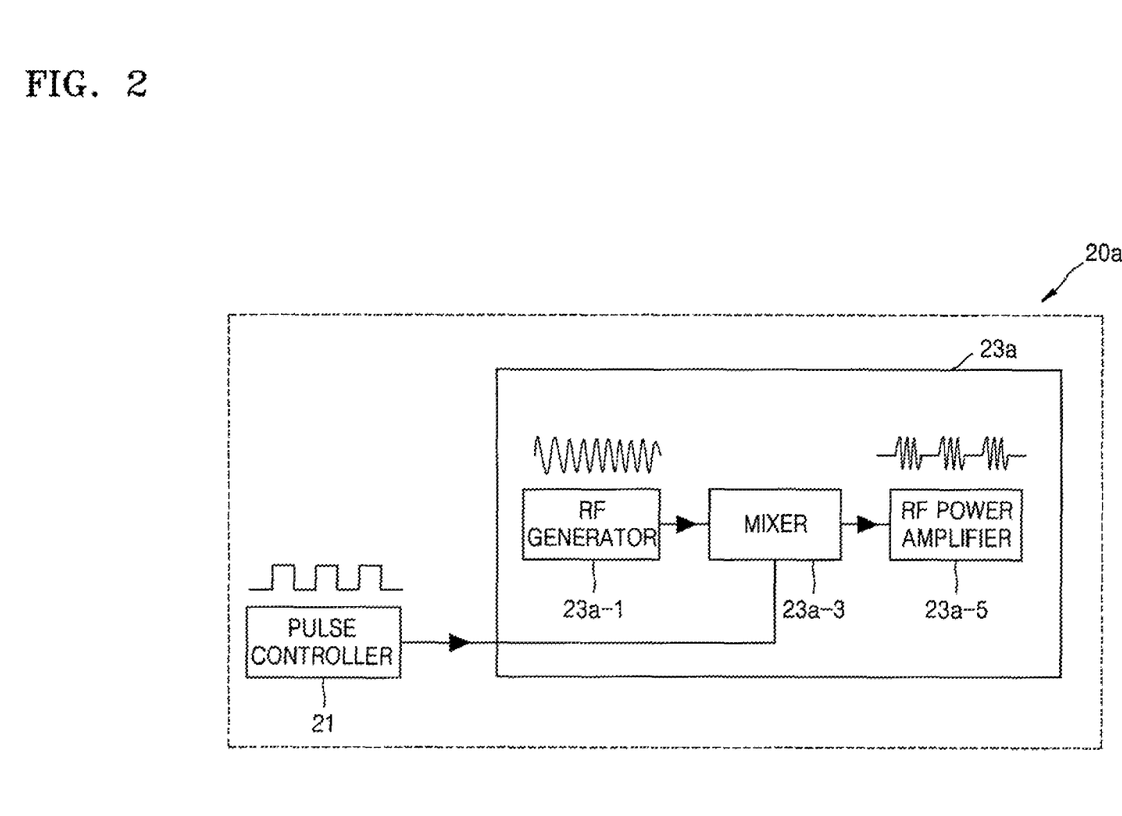
FIG. 2 illustrates a schematic diagram of a pulsed RF power supply included in the diagnosis system for pulsed plasma of FIG. 1A, according to some exemplary embodiments.

FIG. 2 illustrates a schematic diagram of the first pulsed RF power supply 20a included in the diagnosis system for pulsed plasma of FIG. 1A, according to some exemplary embodiments. Referring to FIG. 2, the first pulsed RF power supply 20a may include the pulse controller 21 and the first RF generator 23a.

The pulse controller 21 may generate a signal having a constant common pulse frequency and control the common pulse frequency. The pulse controller 21 may supply the signal having the common pulse frequency to the first RF generator 23a.

The first pulse RF generator 23a may include an RF generator 23a-1, a mixer 23a-3, and an RF power amplifier 23a-5. The RF generator 23a-1 may generate a signal having a first RF frequency. The mixer 23a-3 may mix the signal having the first RF frequency and the signal having the common pulse frequency signal. The RF power amplifier 23a-5 may amplify a pulse signal output from the mixer 23a-3 to be above a certain level.

Referring again to FIG. 1A, the first to third pulse RF generators 23a, 23b, and 23c may be respectively connected to first to third matchers 25a, 25b, and 25c. The first to third matchers 25a, 25b, and 25c may match an impedance of the first to third pulse RF generators 23a, 23b, and 23c so as to efficiently transmit the first to third RF powers to the chamber 10.

The pulse controller 21 may be commonly connected to the first to third pulse RF generators 23a, 23b, and 23c, and transmit thereto the signal with the common pulse frequency. Thus, the first pulsed RF power supply 20a may have the common pulse frequency and the first RF frequency. Furthermore, the second pulsed RF power supply 20b may have the common pulse frequency and the second RF frequency, the third pulsed RF power supply 20c may have the common pulse frequency and the third RF frequency. The common pulse frequency may be relatively low, since the common pulse frequency shows time change turning on or off the pulsed plasma P. As the first to third RF frequencies are natural frequencies determined by a plasma density, they are within a relatively high frequency band. Furthermore, the first RF frequency may be higher than the second and third RF frequencies. For example, the common pulse frequency may be 0.001 MHz, the first RF frequency may be 100 MHz, the second RF frequency may be 13 MHz, and the third RF frequency may be 2 MHz.

Although the diagnosis system for pulsed plasma of the embodiment includes the first to third pulsed RF power supplies 20a, 20b, and 20c, as shown in FIG. 1A, embodiments are not limited thereto. In some embodiments, the diagnosis system for pulsed plasma may include only one pulsed RF power supply connected to the lower electrode in the chuck 11 or the upper electrode 13. Accordingly, in some embodiments, the diagnosis system for pulsed plasma may include only the first pulsed RF power supply 20a. Furthermore, in some embodiments, the diagnosis system for pulsed plasma may further include one or more pulsed RF power supplies in addition to the first to third pulsed RF power supplies 20a, 20b, and 20c.

In some embodiments, the diagnosis system for pulsed plasma may further include a bias power supply connected to the lower electrode included in the chuck 11 and applies bias power. The bias power supplied by the bias power supply may align the pulsed plasma P in a certain direction so that semiconductor processes, e.g., deposition, etching, ion implantation, diffusion, and the like, may be further efficiently performed.

While the pulsed plasma P is generated by a capacitively coupled plasma (CCP) system having two electrodes in parallel to the upper and lower portions in the chamber 10 in FIG. 1A, embodiments not limited thereto. In some embodiments, the pulsed plasma P may be generated by an inductively coupled plasma (ICP) system, an electron cyclotron resonance (ECR) plasma system, an surface wave plasma (SWP) system, a helicon wave plasma system, an e-beam plasma system, a pulsed direct current (DC) system, a CCP system having a dual frequency, and the like. That is, the diagnosis system for pulsed plasma in accordance with embodiments may be used with any pulsed plasma, regardless of how generated.

The reaction gas that is supplied in response to power supplied by the first to third pulsed RF power supplies 20a, 20b, and 20c may generate the pulsed plasma P in the chamber 10 by a reaction with the substrate W and the pulsed plasma P may emit the light signal L. The light signal L may be transmitted to the outside the chamber through a detection window 31 on a side of the chamber 10. The light signal L may be supplied to an optical filter 35 and the OES 30 via an optical cable 33, e.g., an optical fiber.

The optical filter 35 may be placed on the optical cable 33 and allow only the light signal L in a wavelength band that can be detected by the diagnosis system for pulsed plasma to pass through. In some embodiments, the optical filter 35 may be omitted.

The OES 30 may convert the light signal L that has a specific wavelength and passes through the filter 35 into an amplified electrical signal ES. The OES 30 may electrically convert the light signal L generated by the plasma into an electrical signal, amplify the electrical signal, and output the converted amplified electrical signal ES.

A charge coupled element (CCD) may be considered as an OES to detect plasma behavior. The CCD operates at a period of several tens to several hundreds of milliseconds (ms), i.e., a frequency of several tens to several hundred Hertz (Hz). When measuring the behavior of general non-pulsed plasma, as long as the averaged intensity of plasma for the total measuring time is measured, a CCD having such a long light detection reaction time can be used. However, in when measuring the behavior of the pulsed plasma P having a period of several tens to tens of millions microseconds (ips), i.e., a frequency of several hundreds to hundreds of thousands Hz, a CCD may not have a light detection reaction time fast enough to distinguish a pulse-on period from a pulse-off period of the pulsed plasma P. As a result, the CCD may not be sufficiently responsive to accurately measure the behavior of the pulsed plasma P over time.

Accordingly, the diagnosis system for pulsed plasma P according may include the OES 30 having a fast light detection time equal to about several nanoseconds (ns), e.g., a photomultiplier tube, which is fast enough to detect the light signal L. In other words, use of a photomultiplier tube as the OES 30 may allow accurate measurement of the behavior of the pulsed plasma P over time, as the photomultiplier tube can readily distinguish pulse-on period of the pulsed plasma P from the pulse-off period of the same. In some embodiments, the OES 30 may be a light detection apparatus having a time resolution that allows distinguishing the pulse-on period of the pulsed plasma P from the pulse-off period of the same. In some embodiments, the OES 30 may be a light detection apparatus having a nanosecond (ns) time resolution, e.g., on an order of the highest frequency to be detected. In some embodiments, the OES 30 may include a photo diode, e.g., an avalanche photodiode.

The electrical signal ES that passed through the OES 30 may be amplified by an amplifier 37. In some embodiments, the amplifier 37 may be omitted.

The digitizer 40 may synchronize the electrical signal ES output by the OES 30 with a pulse signal PS. For example, the pulse signal PS may be an external pulse signal output by the first pulsed RF power supply 20a. More specifically, referring again to FIG. 2, the pulse signal PS supplied by the pulse controller 21 to the first pulse RF generator 23a may be input to the digitizer 40 by electrical T-branching or direct connecting. The pulse signal PS may include information about start and end points of the pulse signal PS. Thus, the synchronized electrical signal SES that is synchronized with the pulse signal PS records a signal based on the pulse signal PS so that the start and end points of the pulse signal PS may be found out from the measured pulsed plasma P. The synchronized electrical signal SES may be converted from an analog signal to a digital signal by the digitizer 40.

The digitizer 40 may operate according to a method of inputting and storing the electrical signal ES as data of a fixed number at a prescribed time interval. The threshold level of the pulse signal PS may be used as a base of the data recording. For example, as an input value of the pulse signal PS is changed from 0 V to another value, the start point of the pulse signal PS may be measured. Furthermore, the pulse signal PS may be input from the first pulsed RF power supply 20a as described above. More specifically, a unit time interval Δt and a number N of data having the unit time interval Δt may be determined based on a pulse period of the first pulsed RF power supply 20a, and the pulse-on period and the pulse-off period of the pulse signal PS in one period may be distinguished from each other by receiving the N pieces of the data during the one pulse period.

The analyzer 50 may analyze the behavior of the pulsed plasma P from the received synchronized electrical signal SES. That is, the synchronized electrical signal SES may be used to accurately diagnose a magnitude of the pulsed plasma P over time by a fast light detection reaction from the start point of the pulse signal PS and the period of the supplied pulse. That is, the period of the supplied pulse may be divided into the pulse-on period and the pulse-off period, and thus, it is possible to analyze the electrical signal SES corresponding to each of the periods. Thus, the diagnosis system for pulsed plasma of embodiment may accurately diagnose the pulsed plasma P, such as a division of the pulse-on period and the pulse-off period and a diagnosis of a magnitude of the pulsed plasma at a specific time, a delay degree after the pulse-off period, and an averaged intensity of the pulsed plasma in the pulse-on period or the pulse-off period. The diagnosis system according to embodiments may use the synchronized electrical signal SES and the OES having a high time resolution for the diagnosis. The analyzer 50 may be a computer, processor, manager, or controller. Because the algorithms that form the basis of the methods (or operations of the computer, processor, or controller) are described in detail, the code or instructions for implementing the operations of the method embodiments may transform the computer, processor, or controller into a special-purpose processor for performing the methods described herein.

In some embodiments, the pulse signal PS may be divided into the pulse-on period and the pulse-off period and the diagnosis system for pulsed plasma of the embodiment may determine a parameter indicating the behavior of the pulsed plasma P. For example, the parameter may be at least one from among a first maximum signal magnitude value defined as the maximum electrical signal magnitude value in the pulse-on period, a first maximum signal time when the first maximum signal magnitude value occurs, a first minimum signal magnitude value defined as the minimum electrical signal magnitude value in the pulse-on period, a first minimum signal time when the first minimum signal magnitude value occurs, a first average signal magnitude value defined as an average of an electrical signal magnitude value in the pulse-on period, a first standard deviation value defined as a standard deviation corresponding to the first average signal magnitude value, a second maximum signal magnitude value defined as the maximum electrical signal magnitude value in the pulse-off period, a second maximum signal time when the second maximum signal magnitude value occurs, a second minimum signal magnitude value defined as the minimum electrical signal magnitude value in the pulse-off period, a second minimum signal time when the second minimum signal magnitude value occurs, a second average signal magnitude value defined as an average of an electrical signal magnitude value in the pulse-off period, and a second standard deviation value defined as a standard deviation corresponding to the second average signal magnitude value.

The pulse signal PS may be output by electrical T-branching between the first to third pulse RF generators 23a, 23b, and 23c from the pulse controller 21, but embodiments are not limited thereto. In some embodiments, the pulse signal PS may be directly supplied from the pulse controller 21 to the digitizer 40. Reference mark D denotes the direct extraction of the pulse signal PS.

Figure 1B:
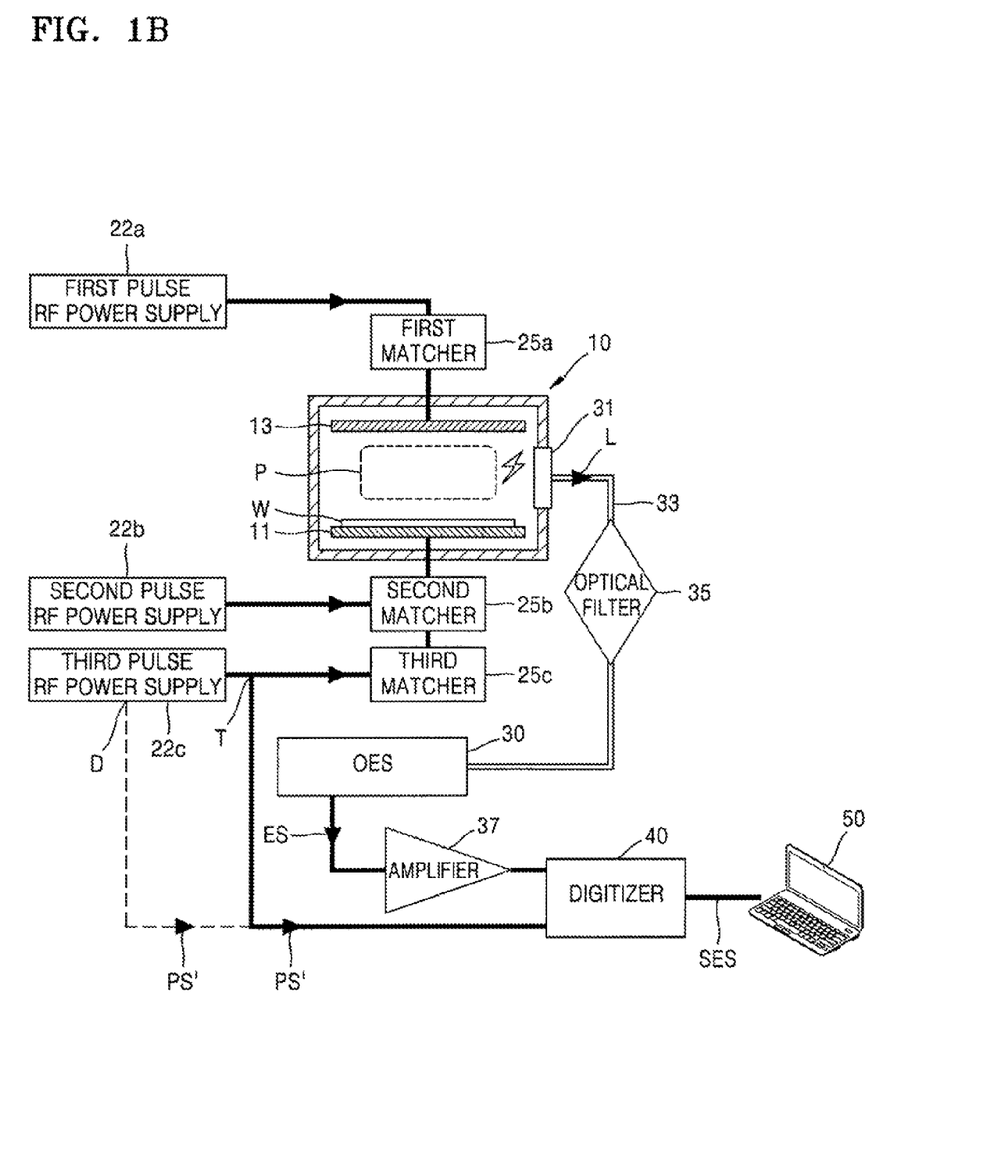

FIG. 1B illustrates a schematic diagram of a diagnosis systems for pulsed plasma according to some exemplary embodiments. The diagnosis system for pulsed plasma of FIG. 1B is similar to the diagnosis system for pulsed plasma in FIG. 1A, but has a different configuration of the pulse generating apparatus.

As the first to third pulsed RF power supplies 20a, 20b, and 20c commonly include the independent pulse controller 21 of FIG. 1A, they generate the pulse signal in accordance with the pulse controller 21. Meanwhile, referring to FIG. 1B, first to third pulsed RF power supplies 22a, 22b, 22c may respectively include individual pulse RF generators generating the pulse signal PS' so that they are independently formed. The pulse signal PS' may be supplied by electrical T-branching between one of the first to third pulsed RF power supplies 22a, 22b, and 22c, and a corresponding one of the first to third matchers 25a, 25b, and 25c, but embodiments are not limited thereto. In some embodiments, the pulse signal PS' may be directly supplied from one of the first to third pulsed RF power supplies 22a, 22b, and 22c to the digitizer 40. As shown in FIG. 1B, the pulse signal PS' may be supplied form the third pulse RF power supply 23c, although may be from any one of the pulsed RF power supplies 22a, 22b, and 22c, e.g., one with the lowest pulse frequency PS'.

Figure 3:
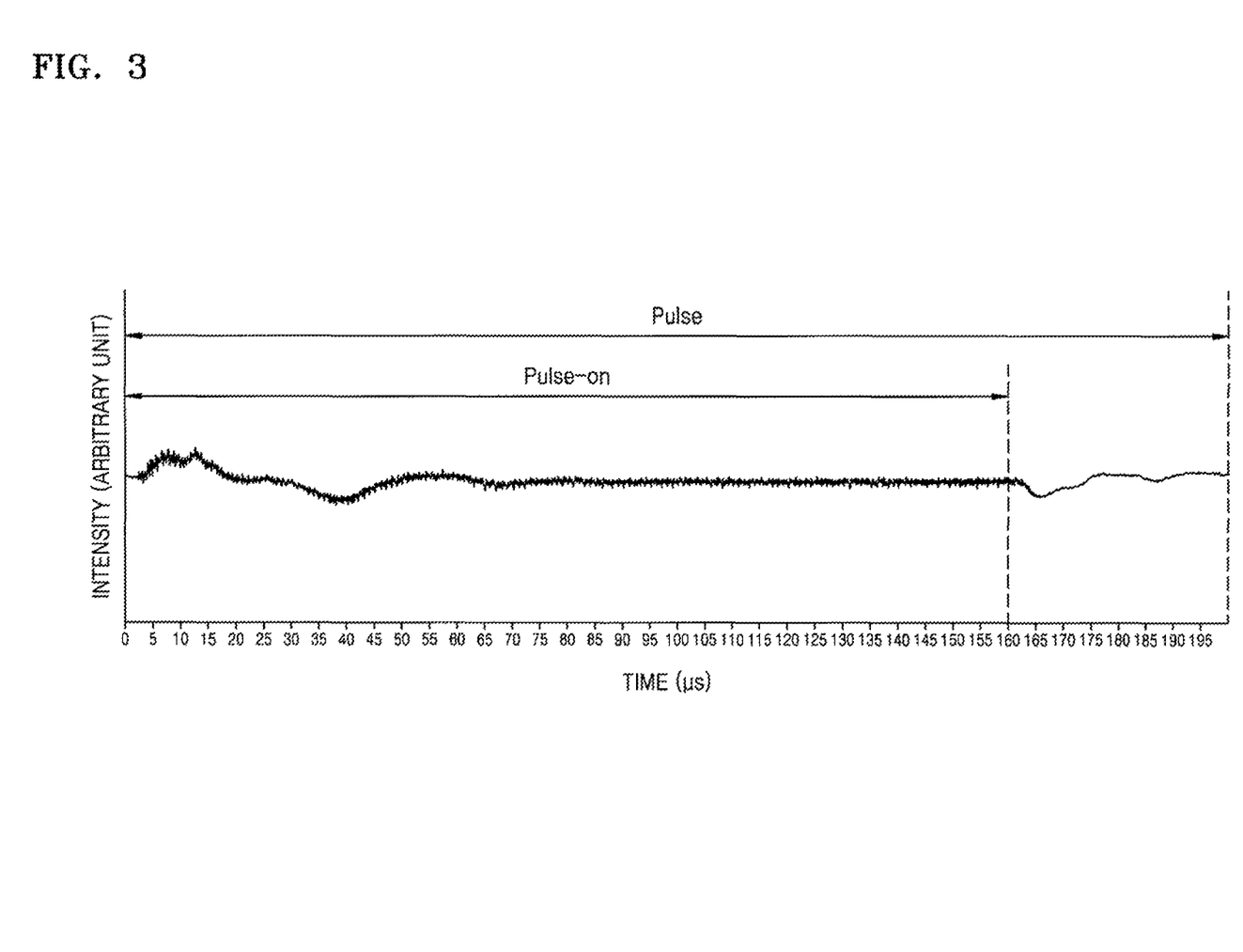
FIG. 3 illustrates a graph of one-period waveform of pulsed plasma, the graph being obtained by using a diagnosis system for pulsed plasma according to some exemplary embodiments.

FIG. 3 illustrates a graph of one-period waveform of pulsed plasma, the graph being obtained by using the diagnosis system for pulsed plasma according to some exemplary embodiments.

Referring to FIG. 3, the waveform shows an intensity of the pulsed plasma over time, i.e., a magnitude of the synchronized electrical signal SES. This graph is obtained by storing N pieces of magnitude data of the synchronized electrical signal SES at the prescribed time interval $\Delta t$ during one period. As described with respect to FIG. 1A, the synchronized electrical signal SES may be measured by distinguishing the pulse-on period from the pulse-off period of the pulse signal. Based on the measured magnitude data of the synchronized electrical signal SES, parameters of the pulse-on period and the pulse-off period, e.g., the maximum value of the synchronized electrical signal SES, a time when the maximum value occurs, the minimum value, a time when the minimum value occurs, an average value, a standard deviation, and so on, may be respectively determined. These values may be used for verifying or diagnosing the stability and reproducibility of an applied pulse or the pulsed plasma.

Figure 4:
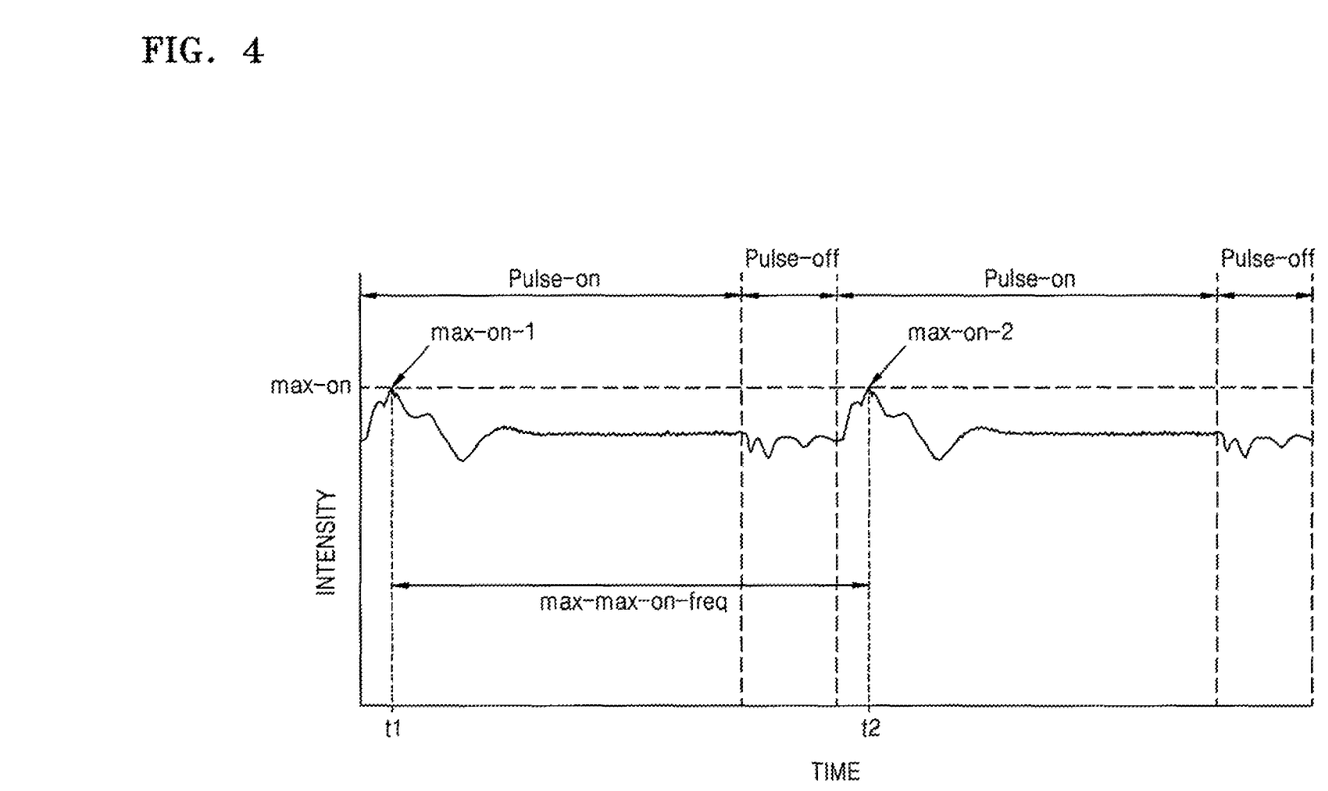
FIG. 4 illustrates a graph obtained by using a method of measuring a parameter of pulsed plasma by using a diagnosis system for pulsed plasma according to some exemplary embodiments.

FIG. 4 illustrates a graph obtained by measuring a parameter of pulsed plasma using a diagnosis system for pulsed plasma according to some exemplary embodiments.

Referring to FIG. 4, the parameter of the pulsed plasma may be measured within a range of the electrical signal obtained over two periods of the supplied pulse. For example, the electrical signal obtained over two periods of the supplied pulse may be used in order to calculate the period of the pulsed plasma. The period of the pulsed plasma may be measured by calculating a time difference (t2−t1) between points in time where maximum values max-on-1 and max-on-2 occur in the pulse-on period in the data obtained during each of the periods of the supplied pulse, that is, the maximum values of the electrical signal. Similarly, the period of the pulsed plasma may be measured by using a time difference between points in time when the minimum value of the electrical signal occurs in the pulse-on period, or a time difference between points in time when the maximum value or the minimum value of the electrical signal occur in the pulse-off period. Thus, according to the diagnosis system of embodiments, the diagnosis system may compare the period of pulsed plasma and the period of the supplied pulse and may determine whether the supplied pulse signal is actually transmitted to the pulsed plasma or not.

Figure 5:
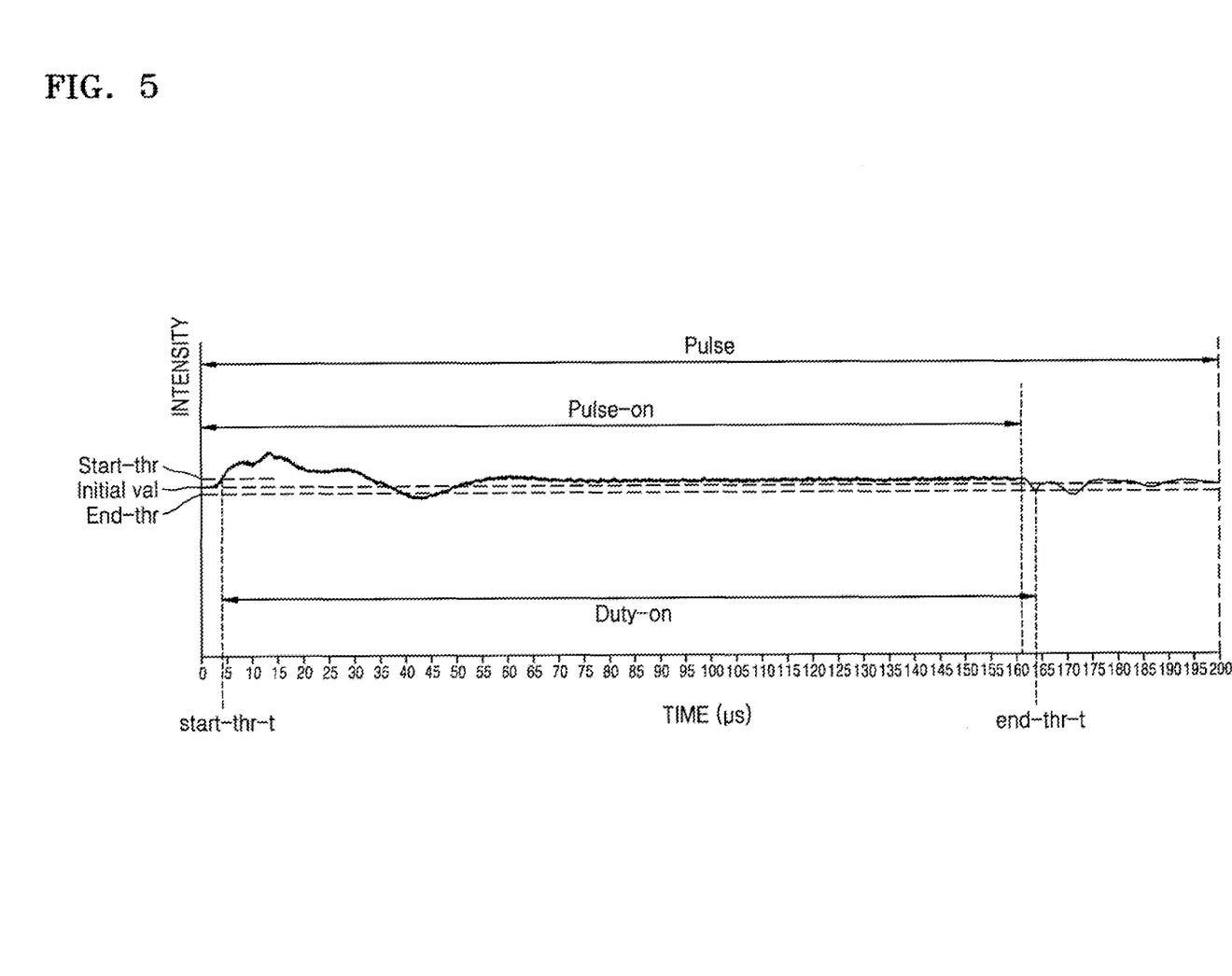
FIG. 5 illustrates a graph showing a duty ratio of pulsed plasma diagnosed by using a diagnosis system for pulsed plasma according to some exemplary embodiments.

FIG. 5 illustrates a graph of a duty ratio of pulsed plasma, the graph being obtained by using the diagnosis system for pulsed plasma according to some exemplary embodiments of embodiments. The duty ratio may represent a ratio of the duty-on period to a period of pulsed plasma.

Referring to FIG. 5, the duty ratio may be calculated based on a reaction time of an RF power supply. An intensity Initial-val at the start point in a pulse-on period may be a reference value. The intensity Initial-val at the start point may be a start threshold intensity Start-thr that becomes higher than the intensity Initial-val at the start point over time at a certain ratio, and the time start-thr-t of when may be defined as a start point of an actual pulse. The pulsed plasma may be stabilized, in which case, the pulsed plasma has constant intensity over time. When the time further elapses, the intensity of the stabilized pulsed plasma may decrease as the pulsed plasma reaches the pulse-off period where an end threshold intensity End-thr becomes less than the intensity Initial-val at the start point at the certain ratio. A time End-thr-t corresponding to the end threshold intensity End-thr-t may be defined as an end point of the actual pulse. The duty ratio may be calculated when a duration between the time start-thr-t at the start threshold intensity and the time End-thr-t at the end threshold intensity overs the period of the pulsed plasma. Thus, according to the diagnosis system of embodiments, whether the supplied pulse is actually transmitted or not to the pulsed plasma may be determined by comparing the duty ratio of the pulsed plasma with a duty ratio of the supplied pulse.

Figure 6A:
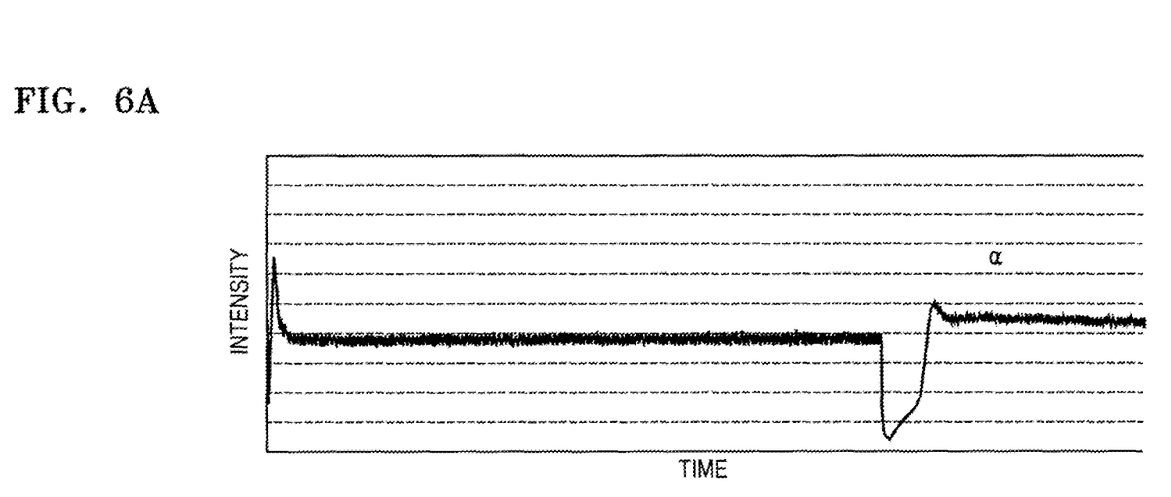
FIGS. 6A and 6B illustrate graphs of waveforms of pulsed plasma diagnosed by using a diagnosis system according to some exemplary embodiments, respectively.
Figure 6B:
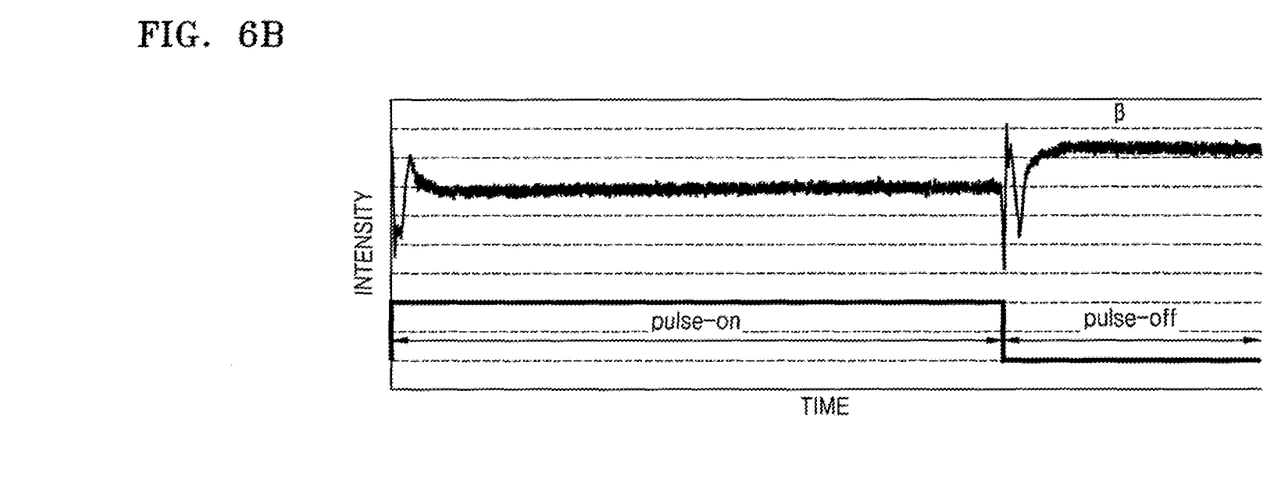

FIGS. 6A and 6B illustrate graphs of waveforms of a pulsed plasma obtained by using a diagnosis system according to an aspect. FIGS. 6A and 6B respectively illustrate one-period waveforms of the intensity of pulsed plasma in an α chamber and a β chamber. As the β chamber is designed to solve a problem of delay after the pulse-off period that occurs in the α chamber, the pulsed plasma in the α and β chambers may be diagnosed by using the diagnosis system according to embodiments, so that the degree of improvement of the β chamber over the α chamber may be confirmed.

Referring to FIG. 6A, the diagnosis system for pulsed plasma according to the embodiment may detect the delay of the pulsed plasma formed in the α chamber after a pulse-off period of a pulse signal.

Referring to FIG. 6B, the diagnosis system for pulsed plasma according to the embodiment may diagnose whether a proper reaction of the pulsed plasma occurs in the β chamber in a pulse-on period of the applied voltage and no delay of the pulsed plasma occurs after the pulse-off period of the applied voltage.

In the case of a general diagnosis system, it is difficult to confirm a delay of the pulsed plasma after the pulse-off period of the pulse signal because of the inability of this system to distinguish the pulse-on period from the pulse-off period. That is, as the waveforms of the pulsed plasma generated in the α and β chambers are similar to each other, it is difficult to accurately confirm the degree of improvement realized by the β chamber. However, according to the diagnosis system for pulsed plasma of embodiments, the pulse-on period and the pulse-off period in one period of pulse signal shown may be fixed due to use of the synchronized electrical signal SES. Furthermore, the diagnosis system of embodiments may accurately diagnose a degree of the delay of the pulsed plasma after the pulse-off period of the pulse signal due to use of the OES 30 having a high time resolution that allows the diagnosis system to distinguish the pulse-on period from the pulse-off period of the pulse signal.

Thus, the diagnosis system according to embodiments may detect the characteristics and degree of improvement of the equipment using the pulsed plasma as the changes in the pulsed plasma according to the change in the environment of the chamber can be accurately detected.

Figure 7:
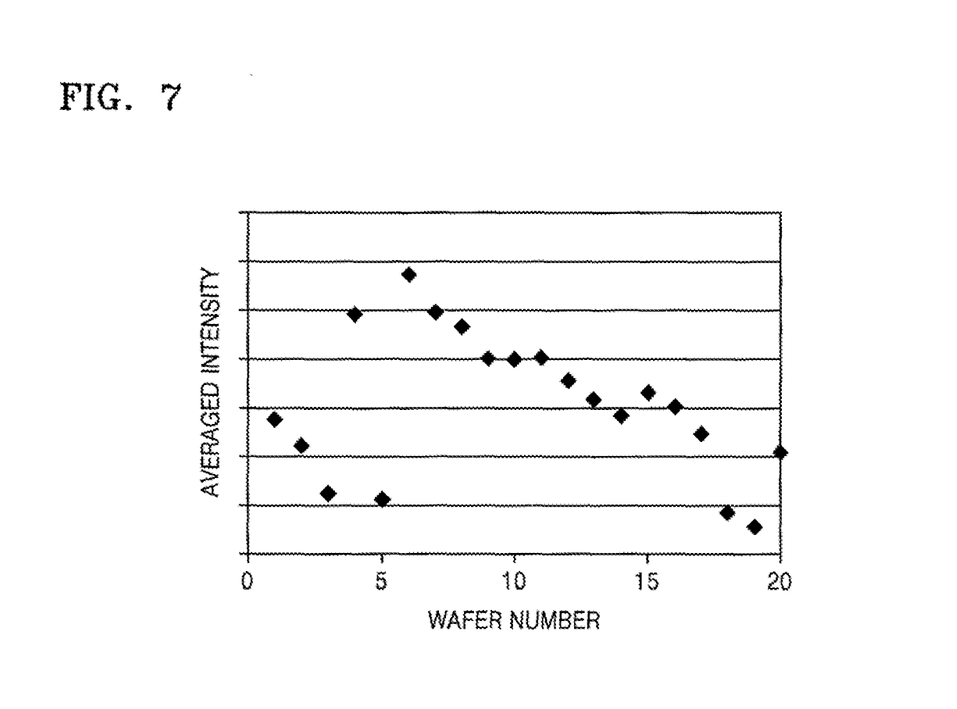
FIG. 7 illustrates a graph of a wafer averaged intensity obtained by using a diagnosis system according to an embodiment.

FIG. 7 illustrates a graph of a wafer averaged intensity after the pulse-off period of a pulse signal, the graph being obtained by using the diagnosis system according to an embodiment.

Referring to FIG. 7, an averaged intensity of the pulsed plasma in a pulse-off period of the pulse signal with respect to a plurality of wafers. A degree of reaction even after the pulse-off period, i.e., a degree of delay, may be determined by measuring the averaged intensity of the pulsed plasma in the pulse-off period. As the averaged intensity of all of the plurality of wafers is a finite value, it may be determined that the pulsed plasma is generated even after the pulse-off period of the applied voltage. However, the diagnosis system according to embodiments may determine that the conditions of the plurality of wafers are mutually different from one another based on the different magnitudes used to obtain the averaged intensity with respect to the plurality of wafers.

As the general diagnosis system may not distinguish the pulse-on period from the pulse-off period of the pulse signal, it is difficult to separately measure the averaged intensity of the pulsed plasma only in the pulse-off period of the pulse signal. In contrast, the diagnosis system for pulsed plasma of embodiments may measure the electrical signal which is synchronized with the period of the pulse signal, so that the start point of the pulse-on period can be determined and, as the OES 30 has a high time resolution, also distinguish the pulse-on period from the pulse-off period of the pulse signal. Thus, it is possible to measure the intensity of the pulsed plasma only in the pulse-off period of the pulse signal, and further measure the averaged intensity in the pulse-off period of the pulse signal as illustrated in FIG. 7.

Figure 8:
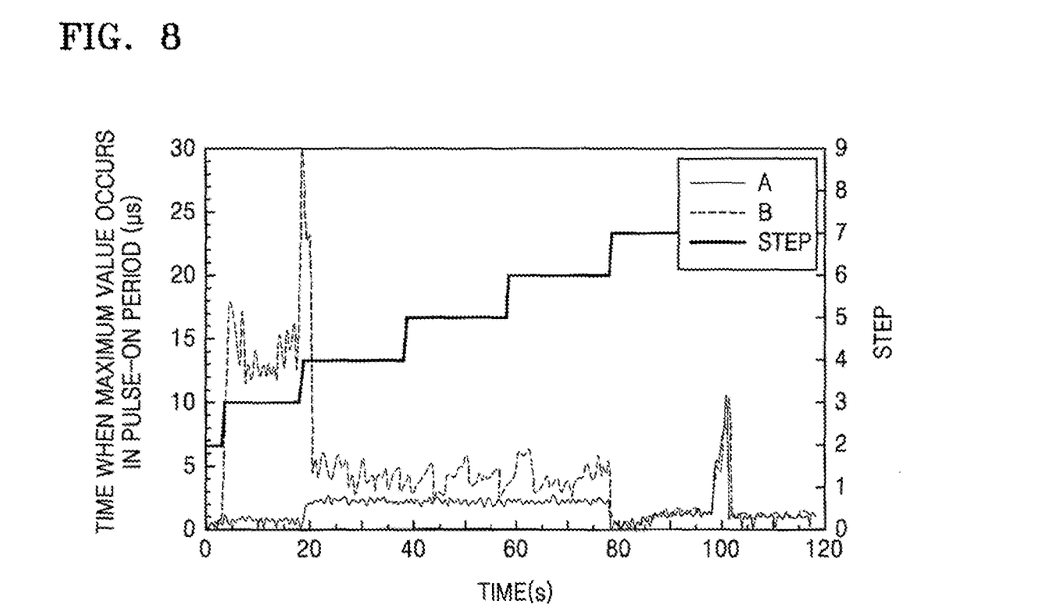
FIG. 8 illustrates a graph of time at the maximum value of pulsed plasma in a pulse-on period versus time, the graph being obtained by using a diagnosis system according to an embodiment.

FIG. 8 illustrates a graph showing a point in time when a magnitude of the pulsed plasma becomes a maximum, the graph being obtained by using the diagnosis system according to an embodiment.

Referring to FIG. 8, a change of the point in time when the magnitude of the pulsed plasma becomes maximum may be detected by using the diagnosis system for pulsed plasma of the embodiment, so that it is possible to evaluate whether the pulsed plasma P has a periodic stability or not according to a first condition A and a second condition B over successive time interval steps.

In the case of the first condition A, points in time when the magnitude of the pulsed plasma reaches a maximum are relatively constant. More specifically, it can be seen that the points in time when the magnitude of the pulsed plasma reaches a maximum constantly occur at about every 1 μs within a time range of 5 to 20 seconds. Thus, it can be concluded that the pulsed RF is periodically applied to the chamber so that stable pulsed plasma is generated.

In the case of the second condition B, the points in time when the magnitude of the pulsed plasma reaches a maximum do not occur constantly. More specifically, it can be seen that the points in time when the magnitude of the pulsed plasma becomes maximum occur from a minimum of 13 μs to maximum of 30 μs within a time range of 5 to 20 seconds. Thus, it can be concluded that the pulsed RF is not properly applied to chamber so that instable pulsed plasma is generated.

Thus, the diagnosis system for pulsed plasma of embodiments may determine the start point of the pulse-on period of the pulse signal due to synchronization with the period of the supplied pulse and may also measure a magnitude of the pulsed plasma corresponding to a specific time as the time resolution of the diagnosis system is equal to the high time resolution of the OES. Therefore, the diagnosis system of embodiments may diagnose whether the pulsed plasma has a periodic stability or not. Meanwhile, the general diagnosis system may measure only a magnitude of the averaged intensity of the pulsed plasma over a relatively wide time range, but may not measure a magnitude of the pulsed plasma according to a specific time. Thus, the general diagnosis system may not diagnose whether the pulsed plasma has periodic stability or not by determining whether the points in time when the magnitude of the pulsed plasma becomes maximum described above occur constantly or not.

Figure 9:
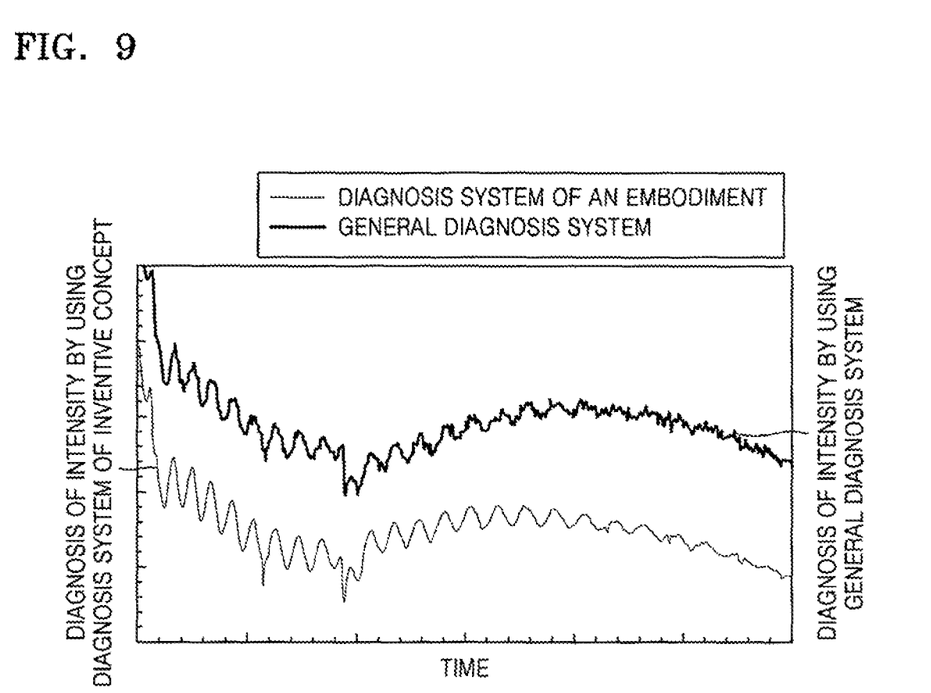
FIG. 9 illustrates a graph of waveforms of pulsed plasma used in an etching process, the waveforms respectively corresponding to a general diagnosis system and a diagnosis system according to an embodiment.

FIG. 9 illustrates a graph of intensities of pulsed plasma in an etching process, the intensities being measured by a general diagnosis system and a diagnosis system according to an embodiment.

Referring to FIG. 9, the behavior of pulsed plasma during a etching process using a cyano (CN) radical was diagnosed by using the general diagnosis system and the diagnosis system for pulsed plasma according to the embodiment. More specifically, FIG. 9 illustrates a graph of an intensity of light having a wavelength corresponding to the CN radical versus an etching time. Only the intensity of light in the pulse-on period of the pulse signal was measured in order to distinguish operation of the pulsed plasma.

An object to be etched may have a structure including a silicon oxide and a silicon nitride that are iteratively laminated several tens or more times to have a specified thickness. When an etching process for the silicon nitride layer is in progress, a concentration of the CN radical increases, so that an intensity of the pulsed plasma due to the CN radical increases. Thus, the concentration of the CN radical decreases as the silicon layer is removed, so that the intensity of the pulsed plasma due to the CN radical also decreases. Since the silicon oxide and the silicon nitride are iteratively laminated several tens or more times, both the general diagnosis system and the diagnosis system for pulsed plasma according to the embodiment detect a periodic intensity change of the pulsed plasma.

However, while the general diagnosis system has a low signal-to-noise ratio (SNR) as the intensity of the pulsed plasma is measured according to an averaged intensity of the pulsed plasma that does not allow the pulse-on period and the pulse-off period of the pulsed plasma to be distinguished from each other, the diagnosis system for pulsed plasma according to the present embodiment may accurately detect the intensity of the pulsed plasma in the pulse-on period of the pulse signal so that the SNR is much higher than that of the general diagnosis system. Therefore, the diagnosis system for pulsed plasma according to the embodiment may accurately detect the etching degree of each of the layers. Furthermore, an etching apparatus including the diagnosis system for pulsed plasma according to the present embodiment, which was described with reference to FIG. 1A to FIG. 2, may accurately detect an etch end point time of each of the layers, the etching apparatus is suitable for performing a precise etching process.

By way of summation and review, embodiments may provide a diagnosis system for pulsed plasma, the diagnosis system being useful for improving the stability of pulsed plasma, process reproducibility between chambers, and wafer yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A diagnosis system for pulsed plasma, the diagnosis system comprising:
a chamber in which light is to be generated by a reaction between a substrate and the pulsed plasma;
a first pulsed RF power supply to provide a first pulsed RF power corresponding to a pulse signal to the chamber;
an optical emission sensor (OES) to sense generated light and convert the generated light into an electrical signal;
a digitizer to synchronize the electrical signal with the pulse signal; and
an analyzer to analyze the synchronized electrical signal,
wherein
a period of the pulse signal is divided into a pulse-on period and a pulse-off period, and
the analyzer is to determine at least one from among a first maximum signal magnitude value defined as the maximum electrical signal magnitude value in the pulse-on period, a first maximum signal time when the first maximum signal magnitude value occurs, a first minimum signal magnitude value defined as the minimum electrical signal magnitude value in the pulse-on period, a first minimum signal time when the first minimum signal magnitude value occurs, a first average signal magnitude value defined as an average of an electrical signal magnitude value in the pulse-on period, a first standard deviation value defined as a standard deviation corresponding to the first average signal magnitude value, a second maximum signal magnitude value defined as the maximum electrical signal magnitude value in the pulse-off period, a second maximum signal time when the second maximum signal magnitude value occurs, a second minimum signal magnitude value defined as the minimum electrical signal magnitude value in the pulse-off period, a second minimum signal time when the second minimum signal magnitude value occurs, a second average signal magnitude value defined as an average of an electrical signal magnitude value in the pulse-off period, and a second standard deviation value defined as a standard deviation corresponding to the second average signal magnitude value.

2. The diagnosis system as claimed in claim 1, wherein the optical emission sensor is a photo multiplier tube (PMT).

3. The diagnosis system as claimed in claim 2, wherein the photo multiplier tube and the digitizer have a nanosecond time resolution.

4. The diagnosis system as claimed in claim 1, wherein the pulse signal is supplied to the digitizer by electrical T-branching of a signal generated by the first pulsed RF power supply or by direct connection from the first pulsed RF power supply.

5. The diagnosis system as claimed in claim 1, wherein the analyzer is to determine a magnitude of the pulsed plasma at a specific time.

6. The diagnosis system as claimed in claim 1, wherein:
a period of the pulse signal is divided into a pulse-on period and a pulse-off period, and
the analyzer is to analyze the synchronized electrical signal from a start point of the pulse-on period or the pulse-off period.

7. The diagnosis system as claimed in claim 6, wherein:
a period of the pulse signal is divided into a pulse-on period and a pulse-off period, and
the analyzer is to determine a magnitude of the electrical signal in the pulse-on period or a magnitude of the electrical signal in the pulse-off period.

8. The diagnosis system as claimed in claim 1, wherein:
the analyzer is to determine a period of the pulsed plasma, and
the period of the pulsed plasma is measured based on a time difference between times when the first maximum signal occurs, a time difference between times when the first minimum signal occurs, a time difference between times when the second maximum signal occurs, or a time difference between times when the second minimum signal occurs.

9. The diagnosis system as claimed in claim 8, wherein:
the period of the pulsed plasma is divided into a duty-on period defined from a first point in time when the electrical signal magnitude value becomes equal to or greater than a start threshold level in the pulse-on period to a first point in time when the electrical signal magnitude value becomes equal to or less than an end threshold level outside the pulse-on period, and a duty-off period defined as a remaining period of the period of the pulsed plasma excluding the duty-on period, and
the analyzer is to determine a duty ratio equal to a ratio of the duty-on period to the period of pulsed plasma.

10. The diagnosis system as claimed in claim 1, wherein the analyzer is to analyze the synchronized electrical signal over at least two periods of the pulse signal.

11. The diagnosis system as claimed in claim 10, wherein the analyzer is to determine a period of the pulsed plasma and to compare the period of the pulsed plasma to the period of the pulse signal.

12. The diagnosis system as claimed in claim 1, further comprising:
a second pulsed RF power supply to provide to second pulsed RF power in accordance with the pulse signal to the chamber.

13. The diagnosis system as claimed in claim 12, wherein the first and second pulsed RF power supplies commonly include a pulse controller to generate the pulse signal.

14. The diagnosis system as claimed in claim 12, wherein each of the first and second pulsed RF power supplies includes a pulse RF generator to generate the pulse signal.

15. An etching apparatus, comprising:
a chamber in which light is to be generated by an etching reaction between a substrate and a pulsed plasma;
a pulsed RF power supply to provide to pulsed RF power in accordance with a pulse signal to the chamber;
an optical emission sensor to output an electrical signal obtained by electrically converting the generated light;
a digitizer to synchronize the electrical signal with the pulse signal;
a detector to detect an etch end point time based on a magnitude of the synchronized electrical signal; and
an analyzer to analyze the synchronized electrical signal, wherein:
a period of the pulse signal is divided into a pulse-on period and a pulse-off period, and
the analyzer is to determine at least one from among:
a first maximum signal magnitude value defined as the maximum electrical signal magnitude value in the pulse-on period,
a first maximum signal time when the first maximum signal magnitude value occurs, a first minimum signal magnitude value defined as the minimum electrical signal magnitude value in the pulse-on period,
a first minimum signal time when the first minimum signal magnitude value occurs, a first average signal magnitude value defined as an average of an electrical signal magnitude value in the pulse-on period, a first standard deviation value defined as a standard deviation corresponding to the first average signal magnitude value, a second maximum signal magnitude value defined as the maximum electrical signal magnitude value in the pulse-off period, a second maximum signal time when the second maximum signal magnitude value occurs, a second minimum signal magnitude value defined as the minimum electrical signal magnitude value in the pulse-off period, a second minimum signal time when the second minimum signal magnitude value occurs, a second average signal magnitude value defined as an average of an electrical signal magnitude value in the pulse-off period, and a second standard deviation value defined as a standard deviation corresponding to the second average signal magnitude value.

16. A diagnosis system for pulsed plasma, comprising:

an optical emission sensor (OES) to receive light generated by the pulsed plasma and output an electrical signal in accordance with the light, the pulsed plasma having been generated in accordance with a pulse signal;

a digitizer to synchronize the electrical signal with the pulse signal; and an analyzer to analyze the synchronized electrical signal, wherein:

a period of the pulse signal is divided into a pulse-on period and a pulse-off period, and the analyzer is to determine at least one from among:

a first maximum signal magnitude value defined as the maximum electrical signal magnitude value in the pulse-on period, a first maximum signal time when the first maximum signal magnitude value occurs, a first minimum signal magnitude value defined as the minimum electrical signal magnitude value in the pulse-on period, a first minimum signal time when the first minimum signal magnitude value occurs, a first average signal magnitude value defined as an average of an electrical signal magnitude value in the pulse-on period, a first standard deviation value defined as a standard deviation corresponding to the first average signal magnitude value, a second maximum signal magnitude value defined as the maximum electrical signal magnitude value in the pulse-off period, a second maximum signal time when the second maximum signal magnitude value occurs, a second minimum signal magnitude value defined as the minimum electrical signal magnitude value in the pulse-off period, a second minimum signal time when the second minimum signal magnitude value occurs, a second average signal magnitude value defined as an average of an electrical signal magnitude value in the pulse-off period, and a second standard deviation value defined as a standard deviation corresponding to the second average signal magnitude value.

17. The diagnosis system as claimed in claim 16, the pulsed plasma having been generated by a radio frequency, wherein the optical emission sensor has a time resolution on an order of the radio frequency.

18. The diagnosis system as claimed in claim 16, wherein the optical emission sensor is a photo multiplier tube (PMT).

* * * * *